(12) United States Patent
Uppal

(10) Patent No.: US 6,888,179 B2
(45) Date of Patent: May 3, 2005

(54) GAAS SUBSTRATE WITH SB BUFFERING FOR HIGH IN DEVICES

(75) Inventor: Parvez N. Uppal, Laurel, MD (US)

(73) Assignee: Bae Systems Information and Electronic Systems Integration INC, Nashua, NH (US)

( * ) Notice: Subject to any disclaimer, the term of this patent is extended or adjusted under 35 U.S.C. 154(b) by 90 days.

(21) Appl. No.: 10/418,230

(22) Filed: Apr. 17, 2003

(65) Prior Publication Data

US 2005/0040429 A1 Feb. 24, 2005

(51) Int. Cl.$^7$ .............................................. H01L 31/072
(52) U.S. Cl. .................... 257/190; 257/13; 257/14; 257/15; 257/21; 257/22; 257/191
(58) Field of Search ............................. 257/13–25, 28, 257/190

(56) References Cited

U.S. PATENT DOCUMENTS

| | | | |
|---|---|---|---|
| 4,963,949 A | 10/1990 | Wanlass et al. | |
| 5,047,822 A | 9/1991 | Little, Jr. et al. | |
| 5,068,867 A | 11/1991 | Hasenberg et al. | |
| 5,519,529 A | 5/1996 | Ahearn et al. | |
| 5,770,868 A | * 6/1998 | Gill et al. | 257/190 |
| 5,883,564 A | 3/1999 | Partin | |
| 5,917,201 A | 6/1999 | Ming-Jiunn et al. | |
| 5,965,899 A | 10/1999 | Little, Jr. | |
| 6,043,426 A | 3/2000 | DePoy et al. | |
| 6,150,604 A | 11/2000 | Freundlich et al. | |
| 6,323,545 B1 | 11/2001 | Michii | |
| 6,326,639 B1 | 12/2001 | Schneider et al. | |
| 6,355,939 B1 | 3/2002 | Dodd | |
| 6,399,971 B1 | 6/2002 | Shigematsu et al. | |
| 6,410,917 B1 | 6/2002 | Choi | |
| 6,420,728 B1 | * 7/2002 | Razeghi | 257/14 |
| 6,423,896 B1 | 7/2002 | Keegan | |
| 2001/0019849 A1 | 9/2001 | Manabe et al. | |

FOREIGN PATENT DOCUMENTS

| | | |
|---|---|---|
| WO | WO 92/17908 | 10/1992 |
| WO | WO 00/07248 | 2/2000 |
| WO | WO 00/16409 | 3/2000 |

OTHER PUBLICATIONS

Wang, C.A., et al, GaInAsSb Materials for Thermophotovoltaic Devices, Lockheed Martin Corporation, Schenectady, NY.
Donetsky, D. et al, Reduction of Surface Recombination Velocity in GaInAsSb/AlGaAsSb/GaSb TPV Devices, Lockheed Martin Corporation, Schenectady, NY.
Watkins, S.P. et al, High mobility InAs grown on GaAs substrates using tertiarybutylarsine and trimethylindium, Appl. Phys. Lett., Feb. 13, 1995, vol. 66 (7).
Gee, James M., Selective Emitters Using Photonic Crystals for Thermopholovoltaic Energy Conversion, 29$^{th}$ IEEE Photovoltaic Specialists Conference, May 2002, New Orleans, LA.
Shellenbarger, Zane, et al, GaInAsSb and InAsSbP Photodetectors for Mid–Infrared Wavelengths, Presented at Aerosense '98, Apr. 1998, Orlando, FL.

* cited by examiner

Primary Examiner—David Nelms
Assistant Examiner—Andy Huynh
(74) Attorney, Agent, or Firm—Maine & Asmus

(57) ABSTRACT

GaAs substrates with compositionally graded buffer layers for matching lattice constants with high-Indium semiconductor materials such as quantum well infrared photoconductor devices and thermo photo voltaic devices are disclosed.

20 Claims, 3 Drawing Sheets

| Device Type | Lattice Constant (Angstroms) | Lattice Matched Compounds (Device) | Bandgap Wavelength (micron) |
|---|---|---|---|
| GaAs | 5.65 | AlGaAs/GaAs (Substrate) | 0.85 |
| InP | 5.88 | $In_{.5}Ga_{.5}As/In_{.5}Al_{.5}As$ (QWIP Devices) | 1.5 |
| GaSb | 6.095 | $Ga_xIn_{1-x}As_ySb_{1-y}$ (TPV Devices) | 2.0 to 2.5 |

Fig. 3

GAAS SUBSTRATE WITH SB BUFFERING FOR HIGH IN DEVICES

FIELD OF THE INVENTION

The invention relates to GaAs substrates, and more particularly, to GaAs substrates with Sb buffering for high In containing devices.

BACKGROUND OF THE INVENTION

Semiconductor devices that are fabricated using InP (Indium Phosphide) based substrates tend to outperform those fabricated using Gallium arsenide (GaAs) substrates, in that they have lower effective electron mass and a higher conduction band discontinuity ($\Delta Ec$). However, fabrication and processing of Indium-containing substrates, such as InP, is more difficult than the processing of GaAs substrates. In addition, they are significantly more costly. There is a need, therefore, for techniques to form or grow Indium-based semiconductors on GaAs substrates.

A major difficulty in fabricating a high Indium content semiconductor on a GaAs substrate is related to the differences in the corresponding crystal lattice constants. In general, the lattice constant of an Indium-based material is larger than that of GaAs. As such, an Indium-based semiconductor material formed directly on a GaAs substrate gives rise to a mismatch in lattice constants. Strain caused by this mismatch result in dislocations in the semiconductor material thereby degrading device performance and or reducing yield.

In the past, strain-relieving buffer layers have been used to compensate for lattice mismatch. U.S. Pat. No. 5,770,868, which is incorporated herein by reference in its entirety, discloses an Antimony (Sb) buffer layer that makes a lattice constant transition between a GaAs substrate and a high-Indium epitaxially deposited semiconductor. The buffer layer is an epitaxial layer including atoms of two Group III elements (e.g., Gallium and Aluminum), and atoms of two Group V elements (e.g., Arsenic and Antimony). The ratio of atoms of at least one group are varied along the depth of the buffer layer, in a manner which makes a transition of the lattice constant between that of the GaAs substrate and the high-Indium semiconductor material. However, when the Gallium and Indium content is changed, the resulting bandgap and the lattice constant are also changed. Thus, flexibility can be limited.

What is needed, therefore, are techniques for forming Indium containing semiconductor materials on a GaAs substrate that afford flexibility in adjusting the lattice constant and bandgap independently and the $Ga_xIn_{1-x}AsSb_{1-y}$ semiconductor compounds.

BRIEF SUMMARY OF THE INVENTION

One embodiment of the present invention provides a quantum well infrared photoconductor device. The device includes a GaAs substrate, and a buffer disposed on the GaAs substrate. The buffer includes graded layers of $Al_{0.5}Ga_{0.5}As_xSb_{1-x}$, where x gradually increases from 0 to 0.5 to effect a lattice transition from the GaAs substrate to a first n+ $In_yGa_{1-y}As$ contact layer disposed on the buffer. A number of quantum well layers are stacked on the first n+ $In_yGa_{1-y}As$ contact layer, each quantum well layer including an $In_yAl_{1-y}As$ layer and an $In_yGa_{1-y}As$ layer. A second n+ $In_yGa_{1-y}As$ contact layer is disposed on the stacked quantum well layers. In one particular embodiment, x is incremented by 0.1 thereby providing a buffer having six graded layers of $Al_{0.5}Ga_{0.5}As_xSb_{1-x}$, and the first n+ $In_yGa_{1-y}As$ contact layer is n+ $In_yGa_{1-y}As$, where y equals 0.5. The quantum well layers may include, for example, 20 to 40 alternating layers of $In_yAl_{1-y}As$ and an $In_yGa_{1-y}As$.

Another embodiment of the present invention provides a thermo photo voltaic device. The device includes a GaAs substrate, and a buffer disposed on the GaAs substrate. The buffer includes graded layers of $GaAs_xSb_{1-x}$, where x gradually decreases from 0.9 to 0 to effect a lattice transition. A p-GaInAsSb layer paired with an n-GaInAsSb layer is stacked on the buffer. The paired layers are adapted to generate power from received radiation. In one particular embodiment, x is decremented by 0.1 thereby providing a buffer having ten graded layers of $GaAs_xSb_{1-x}$. The p-GaInAsSb layer may be, for example, $Ga_{0.8}In_{0.2}As_{0.07}Sb_{0.93}$, with the n-GaInAsSb layer being the same. There may be a plurality of such paired p-GaInAsSb and n-GaInAsSb layers stacked on the buffer. Each of the p-GaInAsSb layer and the n-GaInAsSb layer has an As—Sb ratio and a Ga—In ratio, and each layer is associated with a lattice constant and a bandgap, wherein the lattice constant is determined by the As—Sb ratio, and the bandgap is determined by the Ga—In ratio.

Another embodiment of the present invention provides a quantum well infrared photoconductor device. The device includes a GaAs substrate that is transparent to infrared light, and a buffer disposed on the GaAs substrate. The buffer includes graded layers of $Al_{0.5}Ga_{0.5}As_xSb_{1-x}$, where x gradually increases from 0 to 0.5 to effect a lattice transition from the GaAs substrate to an Indium-based quantum well structure. In another embodiment, a thermo photo voltaic device is provided that includes a GaAs substrate that is transparent to infrared light, and a buffer disposed on the GaAs substrate. The buffer includes graded layers of $GaAs_xSb_{1-x}$, where x gradually decreases to 0 to effect a lattice transition from the GaAs substrate to an Indium-based thermo photo voltaic cell.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 3 is a table of desired devices and their respective lattice matched compounds and bandgaps in accordance with embodiments of the present invention.

DETAILED DESCRIPTION OF THE INVENTION

Embodiments of the present invention extend Sb-based buffer layers to produce QWIP (quantum well infrared photoconductor), as well as TPV (thermo photo voltaic) devices. QWIP devices can be devices for detector applications such as night vision or infrared cameras. TPV devices can be used for converting heat to electricity without any moving parts, and has potential applications in the military as well as civilian arena. Generally stated, an Sb-buffer enables fabrication of a higher In containing device on a GaAs substrate.

QWIP Devices

QWIP devices, and other similar devices such as mid-wave infrared detectors (e.g., wavelengths between 3 and 5 microns), are very difficult to produce on GaAs substrates. This is because they require strained $In_xGa_{1-x}As$ layers. However, a new class of infrared detectors on GaAs substrates are enabled by producing $In_{0.5}Ga_{0.5}As/In_{0.5}Al_{0.5}As$ QWIP devices on GaAs substrates. Such $In_{0.5}Ga_{0.5}As/In_{0.5}Al_{0.5}As$ QWIP devices were previously only possible on InP substrates.

Generally, QWIP devices require planarity or smoothness of the surface of crystal. Sb-based buffer layers provide a high degree of surface smoothness. This surface smoothness enables fabrication of $In_{0.5}Ga_{0.5}As/In_{0.5}Al_{0.5}As$ QWIP devices on GaAs substrates.

Figure 1:
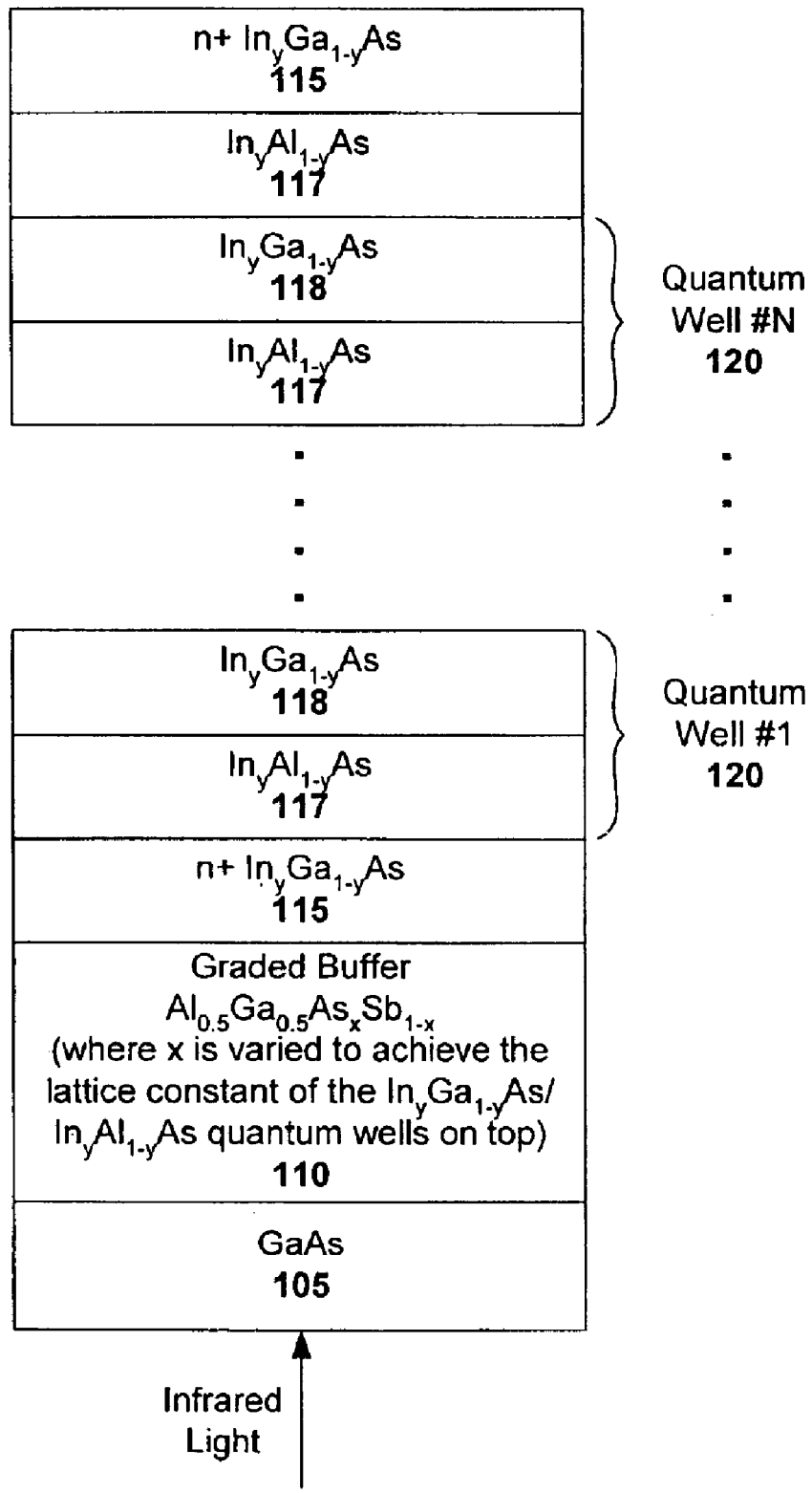
FIG. 1 illustrates a cross sectional view of a quantum well infrared photodetector device configured in accordance with one embodiment of the present invention.

FIG. 1 illustrates a cross sectional view of a QWIP device configured in accordance with one embodiment of the present invention. The device includes a GaAs substrate 105 that is transparent to infrared light, a first n+$In_yGa_{1-y}As$ contact layer 115, a graded buffer 110, a number of quantum well layers 120, and a second n+$In_yGa_{1-y}As$ contact layer 115. Each of the quantum well layers 120 includes an $In_yAl_{1-y}As$ layer 117 and an $In_yGa_{1-y}As$ layer 118.

A QWIP is a monopolar photoconductor device. In operation, photons of infrared light excite carriers (electrons or holes, depending on doping) trapped in a quantum well formed by a first semiconductor sandwiched by layers of a second semiconductor with a higher conduction energy band than the first semiconductor. Excited carriers flow through higher conduction band, and are released from the energy well. An externally applied electric field then carries the released carriers, thereby creating a photocurrent.

In the embodiment illustrated in FIG. 1, the second semiconductor material is $In_yAl_{1-y}As$ layer 117, and the first semiconductor material with a lower conduction energy band is the $In_yGa_{1-y}As$ layers 118, each of which is sandwiched between $In_yAl_{1-y}As$ layers 117. In one such embodiment, each layer 117 is $In_yAl_{1-y}As$, and each layer 118 is $In_yGa_{1-y}As$, where y equals 0.5 The substrate 105 can be, for example, an infrared transparent, bulk substrate that has a GaAs layer deposited thereon, thereby providing a superior surface upon which the graded buffer 110 is deposited.

This buffer 110, in one embodiment, is comprised of layers of $Al_{0.5}Ga_{0.5}As_xSb_{1-x}$, where x gradually increases from 0 to 0.5 to effect the lattice transition. In particular, the ratio of Indium to Gallium gradually transitions the lattice constant from that of GaAs to that of a composition having a substantial fraction of Indium. In one such embodiment, x is incremented by 0.1 thereby providing a buffer 10 having six graded layers of $Al_{0.5}Ga_{0.5}As_xSb_{1-x}$. In the case of HEMT devices, the greater the fraction of Indium, the faster the device. This increase of speed, however, comes at the cost of decreased power ability of the device. The ratio of Indium to Gallium can therefore be adjusted depending on speed and power considerations of a given application.

Note that the lattice constant of the last $Al_{0.5}Ga_{0.5}As_xSb_{1-x}$ layer is equal to the lattice constant of the rest of the device on top. For example, if the lattice constant of $In_yGa_{1-y}As/In_yAl_{1-y}As$ quantum wells on top is 5.88 Angstroms, then the x value in $Al_{0.5}Ga_{0.5}As_xSb_{1-x}$ buffer layer is adjusted in such a manner that it gradually transitions to 5.88 Angstroms for the top layer of $Al_{0.5}Ga_{0.5}As_xSb_{1-x}$. The rationale for choosing Al and Ga to be 0.5 is to achieve a relatively non-conducting layer to provide sufficient isolation between devices. If increased isolation is needed, the Al mole fraction can be raised further, for example, to Al=0.7 and Ga=0.3.

A contact layer 115 of n+ $In_yGa_{1-y}As$ is deposited on the graded buffer 110 structure. This contact layer 115 is configured to match the lattice constant of the upper surface of the graded buffer 110, and in one embodiment is n+ $In_yGa_{1-y}As$, where y equals 0.5. At least one quantum well layer 120 is deposited on the contact layer 115 thereby forming a QWIP structure. In one embodiment of a QWIP structure, between 20 and 40 alternating layers of $In_yAl_{1-y}As$ 117 and $In_yGa_{1-y}As$ 118 are included. A final $In_yAl_{1-y}As$ layer 117 is deposited on top of this series of quantum well layers 120, and then a contact layer of n+ $In_yGa_{1-y}As$ 115.

Received infrared light passes through the IR transparent substrate 105 and buffer layer 110, and is absorbed in the quantum well layers 120 thereby generating a photocurrent. Signals representing the generated photocurrents are effectively manifested at the contact layers 115 so that they can be provided to a signal processing board, such as a multiplexer. A data processor (not shown) can interpret the signals to determine detection status.

U.S. Pat. Nos. 5,047,822, 5,519,529, and 5,965,899 each provide detailed discussion on quantum well technology, and are herein incorporated by reference in their entirety.

TPV Devices

TPV devices employ quaternary devices including GaInAsSb, which can be latticed matched to GaSb. In the case of a TPV device fabricated on a GaAs substrate, a graded transition must be made to the lattice constant of GaSb, which is 6.095 Angstroms. $Ga_xIn_{1-x}As_ySb_{1-y}$ semiconductor compound has four components that can be varied, as opposed to the two variable components in the case of $In_xGa_{1-x}As$ layers used in a QWIP structure. As such, the grading of the Sb buffer has to be done over a thicker or longer interval to reach the lattice constant of GaSb. A typical alloy mole fraction is $Ga_{0.8}In_{0.2}As_{0.07}Sb_{0.93}$.

The lattice constant of a particular TPV device is determined by the As—Sb ratio, and the bandgap is determined by the Ga—In ratio. These two independent variables control the characteristics of the composition. This is not true for conventional AlGaAs devices. Given a bandgap of 0.5 eV (wavelength of about 2.5 micrometers) used in conjunction with a black body or a heat source emitting a temperature of about 1000° C. to 1200° C., it is possible to provide a power conversion system using GaSb for TPV incorporating a buffer as disclosed herein.

Figure 2:
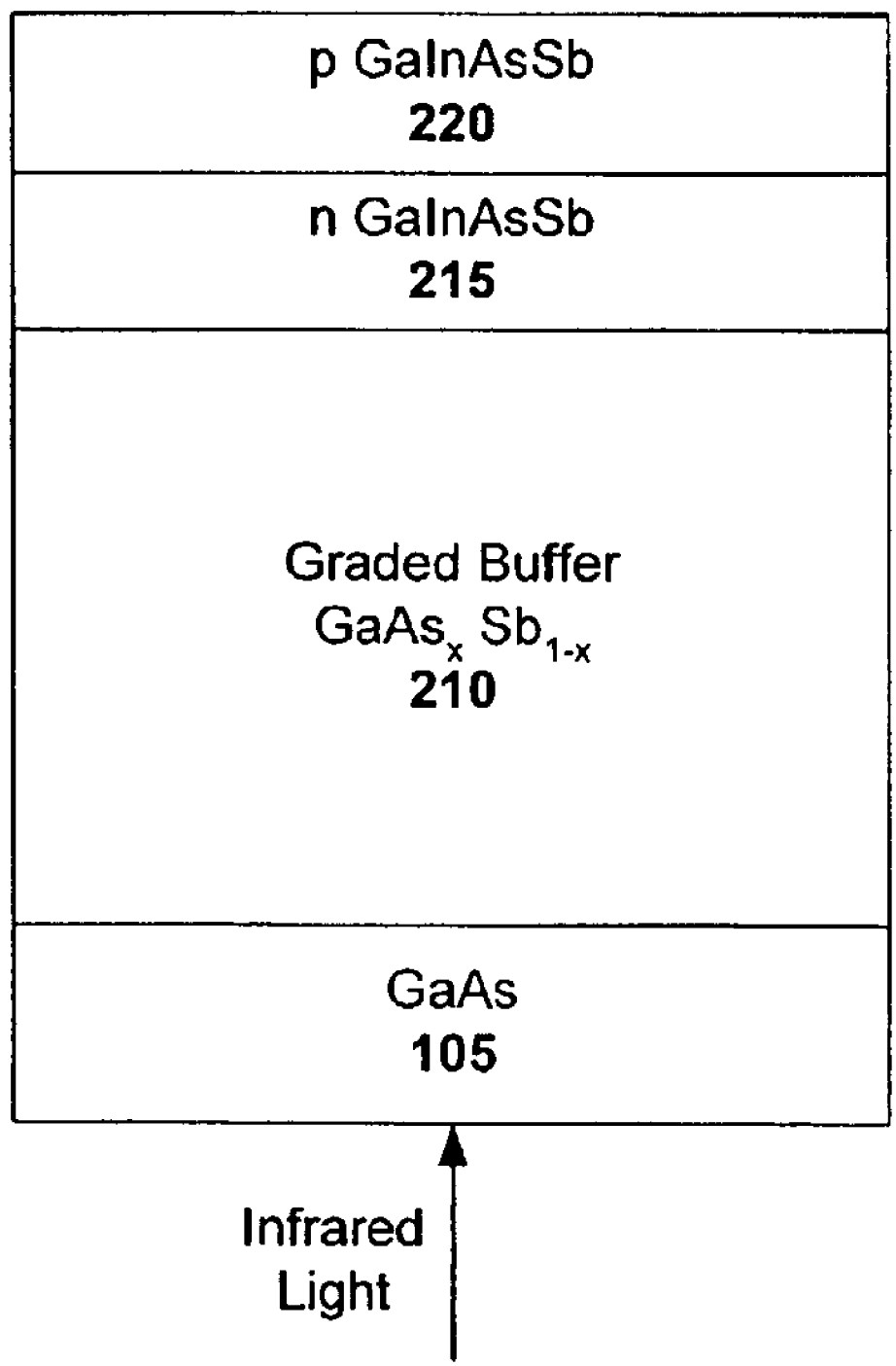
FIG. 2 illustrates a cross sectional view of a thermo photovoltaic cell device configured in accordance with one embodiment of the present invention.

FIG. 2 illustrates a cross sectional view of a TPV cell device configured in accordance with another embodiment of the present invention. The device includes a GaAs substrate 105 that is transparent to infrared light, a graded buffer 210, and a p-GaInAsSb layer 215 paired with an n-GaInAsSb layer 220. The device may include a, number of such pairs. Here, the buffer 210 is configured according to the formula $GaAs_xSb_{1-x}$, where as x goes to 0, and a transition to a semiconductor having a Indium content is achieved.

The buffer 210 in this embodiment is thicker than that illustrated in FIG. 1. For example, the buffer 210 can include a number of layers of $GaAs_xSb_{1-x}$, where x gradually decreases from 0.9 to 0 to effect the lattice transition. In particular, the ratio of Antimony to Gallium gradually transitions the lattice constant from that of GaAs to that of a composition having a substantial GaSb component. In one such embodiment, x is decremented by 0.1 thereby providing a buffer 210 having ten graded layers of $GaAs_xSb_{1-x}$.

As with the device of FIG. 1, infrared light passes through the substrate 105 and the graded buffer 210, and is absorbed in the layers 215 and 220. The respective p-n junctions generate an electric current via a bipolar mechanism thereby producing power. The infrared light, also referred to as IR radiation, may be sourced, for example, from a black body that emits heat in the temperature of about 1000° C. to 1200° C. In general, photovoltaic cells can be used to obtain electricity from a furnace or other suitable heat sources, such as a nuclear reactor.

Photovoltaic cells are of interest for a number of applications, particularly those applications like deep space probes and other locations where there is limited sunlight, as well as in submarine applications requiring a silent power source. In addition, photovoltaic cells provide a long term energy source, for instance, when coupled with a nuclear reactor, which may be desirable in applications where having to refuel would present significant problems.

The table of FIG. 3 illustrates typical values of lattice constants for various alloy compositions and their respective bandgaps. The lattice constants and alloy compositions shown can be employed in numerous QWIP and TPV applications as will be apparent in light of this disclosure. Note that the illustrated lattice constants and bandgap values are no intended as limitations on the present invention. Rather, different combinations of lattice constant and bandgap values which will yield devices of interest for different applications are possible.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A quantum well infrared photoconductor device comprising:
   a GaAs substrate;
   a buffer disposed on the GaAs substrate, the buffer including graded layers of $Al_{0.5}Ga_{0.5}As_xSb_{1-x}$, where x gradually increases front 0 to 0.5 to effect a lattice transition from the GaAs substrate to a first n+ $In_yGa_{1-y}As$ contact layer disposed on the buffer;
   a number of quantum well layers stacked on the first n+ $In_yGa_{1-y}As$ contact layer, each quantum well layer including an $In_yAl_{1-y}As$ layer and an $In_yGa_{1-y}As$ layer; and
   a second n+ $In_yGa_{1-y}As$ contact layer disposed on the stacked quantum well layers.

2. The device of claim 1 wherein x is incremented by 0.1 thereby providing a buffer having six graded layers of $Al_{0.5}Ga_{0.5}As_xSb_{1-x}$.

3. The device of claim 1 wherein the GaAs substrate is an infrared transparent, bulk substrate that has a GaAs layer deposited thereon.

4. The device of claim 1 wherein the contact layers n+ $In_yGa_{1-y}As$ are n+ $In_{0.5}Ga_{0.5}As$.

5. The device of claim 1 wherein the quantum well layers include 20 to 40 alternating layers of $In_yAl_{1-y}As$ layer end an $In_yGa_{1-y}As$.

6. The device of claim 1 wherein the quantum well layers $In_yGa_{1-y}As$ and $In_yGa_{1-y}As$ are $In_{0.5}Al_{0.5}As$ and $In_{0.5}Ga_{0.5}As$, respectively.

7. A quantum well infrared photoconductor device comprising:
   a GaAs substrate that is transparent to infrared light;
   a buffer disposed on the GaAs substrate, the buffer including graded layers of $Al_{0.5}Ga_{0.5}As_xSb_{1-x}$, where x gradually increases from 0 to 0.5 to effect a lattice transition from the GaAs substrate to an Indium-based quantum well structure.

8. The device of claim 7 wherein the quantum well structure includes alternating layers of $In_yAl_{1-y}As$ and $In_yGa_{1-y}As$, where y equals 0.5.

9. The device of claim 8 wherein the quantum well layers $In_yAl_{1-y}As$ and $In_yGa_{1-y}As$ are $In_{0.5}Al_{0.5}As$ and $In_{0.5}Ga_{0.5}As$, respectively.

10. The device of claim 7 wherein the quantum well structure includes 20 to 40 alternating layers of $In_yAl_{1-y}As$ and $In_yGa_{1-y}As$.

11. The device of claim 7 wherein x is incremented by 0.1 thereby providing a buffer having six graded layers of $Al_{0.5}Ga_{0.5}As_xSb_{1-x}$.

12. The device of claim 7 further comprising a first contact layer n+ $In_yGa_{1-y}As$ between the substrate and buffer and a second contact layer n+ $In_yGa_{1-y}As$ on top of the buffer.

13. A quantum well infrared photoconductor device comprising:
   a GaAs substrate;
   a buffer disposed on the GaAs substrate, the buffer including graded layers of $Al_{0.5}Ga_{0.5}As_xSb_{1-x}$, where x gradually increases from 0 to 0.5 to effect a lattice transition from the GaAs substrate to a first n+ $In_yGa_{1-y}As$ contact layer disposed on the buffer;
   20 to 40 alternating quantum well layers stacked on the first n+ $In_yGa_{1-y}As$ contact layer, each quantum well layer including an $In_{0.5}Al_{0.5}As$ layer and an $In_{0.5}Ga_{0.5}As$ layer; and
   a second n+ $In_yGa_{1-y}As$ contact layer disposed on the stacked quantum well layers.

14. The device of claim 13 wherein x is incremented by 0.1 thereby providing a buffer having six graded layers of $Al_{0.5}Ga_{0.5}As_xSb_{1-x}$.

15. The device of claim 13 wherein the GaAs substrate is an infrared transparent, bulk substrate that has a GaAs layer deposited thereon.

16. The device of claim 13 wherein the contact layers n+ $In_yGa_{1-y}As$ are n+ $In_{0.5}Ga_{0.5}As$.

17. A quantum well infrared photoconductor device comprising:
   a GaAs substrate that is transparent to infrared;
   a buffer disposed on the GaAs substrate, the buffer including graded layers of $Al_{0.5}Ga_{0.5}As_xSb_{1-x}$, where x gradually increases from 0 to 0.5 to effect a lattice transition from the GaAs substrate to a first n+ $In_yGa_{1-y}As$ contact layer disposed on the buffer;
   20 to 40 alternating quantum well layers stacked on the first n+ $In_yGa_{1-y}As$ contact layer, each quantum well layer including an $In_yAl_{1-y}As$ layer and an $In_yGa_{1-y}As$ layer
   a second n+ $In_yGa_{1-y}As$ contact layer disposed on the stacked quantum well layers.

18. The device of claim 17 wherein x is incremented by 0.1 thereby providing a buffer having about six graded layers of $Al_{0.5}Ga_{0.5}As_xSb_{1-x}$.

19. The device of claim 17 wherein the quantum well layers $In_yAl_{1-y}As$ and $In_{0.5}Ga_{1-y}As$ are $In_{0.5}Al_{0.5}AS$ and $In_{0.5}Ga_{0.5}As$, respectively.

20. The device of claim 17, wherein the contact layers n+ $In_yGa_{1-y}As$ are n+ $In_{0.5}Ga_{0.5}As$.

* * * * *

UNITED STATES PATENT AND TRADEMARK OFFICE
CERTIFICATE OF CORRECTION

PATENT NO. : 6,888,179 B2
DATED : May 3, 2005
INVENTOR(S) : Parvez N. Uppal

It is certified that error appears in the above-identified patent and that said Letters Patent is hereby corrected as shown below:

Column 3,
Line 49, delete "10", insert -- 110 --.

Column 4,
Line 47, delete "a,", insert -- a --.

Column 5,
Line 17, delete "no", insert -- not --.
Line 52, delete "end", insert -- and --.

Column 6,
Line 58, delete "$In_{0.5}$", insert -- $In_y$ --.

Signed and Sealed this

Third Day of January, 2006

JON W. DUDAS
*Director of the United States Patent and Trademark Office*